United States Patent [19]

Moreno

[11] 4,404,464
[45] Sep. 13, 1983

[54] METHOD AND APPARATUS FOR ELECTRICALLY CONNECTING A REMOVABLE ARTICLE, IN PARTICULAR A PORTABLE ELECTRONIC CARD

[76] Inventor: Roland C. D. Moreno, 30-32, Bvd de Strasbourg, Paris, France, 75010

[21] Appl. No.: 169,114
[22] PCT Filed: Jan. 23, 1979
[86] PCT No.: PCT/FR79/00005
 § 371 Date: Sep. 24, 1978
 § 102(e) Date: Sep. 17, 1979
[87] PCT Pub. No.: WO79/00543
 PCT Pub. Date: Aug. 9, 1979

[30] Foreign Application Priority Data

Jan. 24, 1978 [FR] France ............... 7801876

[51] Int. Cl.³ .............................. G06K 7/01
[52] U.S. Cl. ................... 235/438; 235/441; 235/443; 371/22; 194/4 C; 194/6
[58] Field of Search ......... 200/6 A, 6 R, 46; 235/441, 442, 443, 438; 371/25, 22; 340/508; 29/825; 194/4, 6, 7; 101/DIG. 18; 73/156

[56] References Cited

U.S. PATENT DOCUMENTS

| | | | |
|---|---|---|---|
| 3,459,904 | 8/1969 | Friend | 200/46 |
| 3,463,890 | 8/1969 | Schinner et al. | 200/46 |
| 3,500,318 | 3/1970 | Arlen | 371/22 |
| 3,564,169 | 2/1971 | Sitz | 200/46 |
| 3,633,016 | 1/1972 | Walker | 371/25 X |
| 3,637,994 | 1/1972 | Ellingboe . | |
| 3,749,888 | 7/1973 | Crowley | 200/46 X |
| 3,789,345 | 1/1974 | Reimer et al. . | |
| 3,906,201 | 9/1975 | Housman et al. . | |
| 3,916,156 | 10/1975 | Pass et al. | 235/443 |
| 4,163,210 | 7/1979 | Giraud . | |
| 4,216,577 | 8/1980 | Badet et al. | 29/831 |

*Primary Examiner*—Francis S. Husar
*Assistant Examiner*—Carl J. Arbes
*Attorney, Agent, or Firm*—Sandler & Greenblum

[57] ABSTRACT

The present invention relates to a process and an apparatus for connecting in particular a portable electronic card.

The connector comprises in particular:
 means 5a and 5b for bringing the contact surfaces 1a and 3a to face one another;
 means 15 and 18 for displacing in a relative fashion the two contact surfaces towards one another in a direction having one component at least normal to their contact surface;
 means 13, 5a and 5b for displacing in an oscillatory fashion, around a median point, the contact surfaces with respect to one another in a tangential direction.

The connector has in particular the advantage of facilitating the rapid placement in contact of the contact surfaces.

21 Claims, 7 Drawing Figures

METHOD AND APPARATUS FOR ELECTRICALLY CONNECTING A REMOVABLE ARTICLE, IN PARTICULAR A PORTABLE ELECTRONIC CARD

TECHNICAL FIELD OF THE INVENTION

The present invention relates to a process for electrically connecting a removable article with an electric apparatus and a device for carrying out the process.

BACKGROUND ART

More particularly, the invention relates to the situation where the removable article is a portable electronic card of the type described in French Patent Application Nos. 75 14807 and 2,311,360. Such a card which contains memory circuits has particular application in handling commercial or banking transactions, for example, between client and merchant.

In effect, it is known that such portable electronic cards must be periodically electrically connected with transfer devices with which these cards exchange information (data).

Generally, the process for establishing the electrical contact between the electric (or electronic) circuit contained in the portable card and the electrical apparatus of the transfer device consists of contacting the contact surfaces of classical conductors, respectively associated with the portable electric removable article and the electric apparatus.

Amongst the technical problems which must be resolved, the following are particularly important in the case of portable cards:

In the first place, it is necessary to ensure a good electrical contact while compensating for wearing down and/or crushing of the contact surfaces;

In the second place, one must reduce to a minimum the obstructiveness of the contact surfaces;

In the third place, one must facilitate the rapid contacting of the contact surfaces by the carrier of the portable card; and In the fourth place, it is necessary to limit the wearing down of the contact surfaces.

In view of the present state of the art, these problems to be resolved appear contradictory to a large extent.

DISCLOSURE OF THE INVENTION

The present invention proposes a solution to these problems.

The following solution to the above drawbacks extends beyond the particular case of portable electronic cards and is applicable wherever a removable electrical article (or even a removable article associated with an electric circuit) is to be connected with an electrical apparatus. The process according to the invention comprises the steps of:

(a) bringing the contact surfaces of the two conductors so as to face one another;

(b) relatively displacing the contact surface of the conductors towards each other, along a direction having at least one component normal to their surface, these two first steps having particularly as their aim to facilitate the contacting of the contact surfaces; in effect, during the first phase the operator may displace in a relative manner the two contact surfaces without difficulty because they are not yet in contact; furthermore, and most importantly, it should be noted that in doing this, the edges of the surfaces of contact never abut one against the other;

these two steps are equally performed in a manner which limits the wearing down and the deterioration of the contact surfaces.

(c) displacing in an oscillatory or alternating and relative fashion the two contact surfaces, around a median point, in a direction tangential to their surface, at least as long as these surfaces are in contact. This oscillatory movement can be carried out while the two contact surfaces are constantly in contact and it may equally be carried out by successive passes, i.e. by a repetition of the contacting process.

The purpose of this step of the process in combination with the other steps is to cause an electric contact while limiting the obstruction of the surfaces by virtue of the displacement around a median point.

(d) Testing the electric contact surfaces for correct alignment and electrical contact and stopping the tangential oscillatory displacement when the electric contact has been established. This step of the process has as it purpose, in combination with the preceeding steps, to facilitate the rapid placement in contact because as soon as this has been done, the process stops. The step has furthermore as a purpose in combination with the other steps, to limit the wearing down of the contact surfaces to only that which is absolutely necessary.

It is apparent that certain steps of the process according to the invention alone have an independent value by virtue of the problem or problems which they themselves solve and the present invention further extends to the following intermediate steps:

The first three steps: a, b, c, taken in combination; as well as

The step which comprises seeking good contact for the contact surfaces while displacing the surfaces with respect to one another (or in repeating the process of placing in contact), testing the electrical contact and stopping the seeking of good contact when the contact has been established; as well as The step which comprises seeking good contact for the contact surfaces while displacing these surfaces one with respect to the other around a median point in an oscillatory fashion.

As a subsidiary feature, so as to contribute to accomplishing the goal of good contact, the process according to the present invention may further comprise the steps of:

exerting a pressure sufficient to scratch at least one of the contact surfaces;

the contact surfaces being randomly offset one with respect to the other between two successive oscillations.

BRIEF DESCRIPTION OF THE DRAWINGS

By way of nonlimiting example, one embodiment of the process and connector apparatus for carrying out the process will be described with reference to the annexed drawings.

DESCRIPTION OF PREFERRED EMBODIMENTS

It will be understood in the following description that the front and the rear of frame 6 corresponds respectively to the part of frame 6 shown on the left and on the right of FIGS. 1 and 2. Likewise, the front position of drawer 10 corresponds to the position illustrated in FIG. 2 at the front of frame 6 and the rear position of the drawer 10 corresponds to the position illustrated in FIG. 1 at the rear of the frame.

Figure 1:
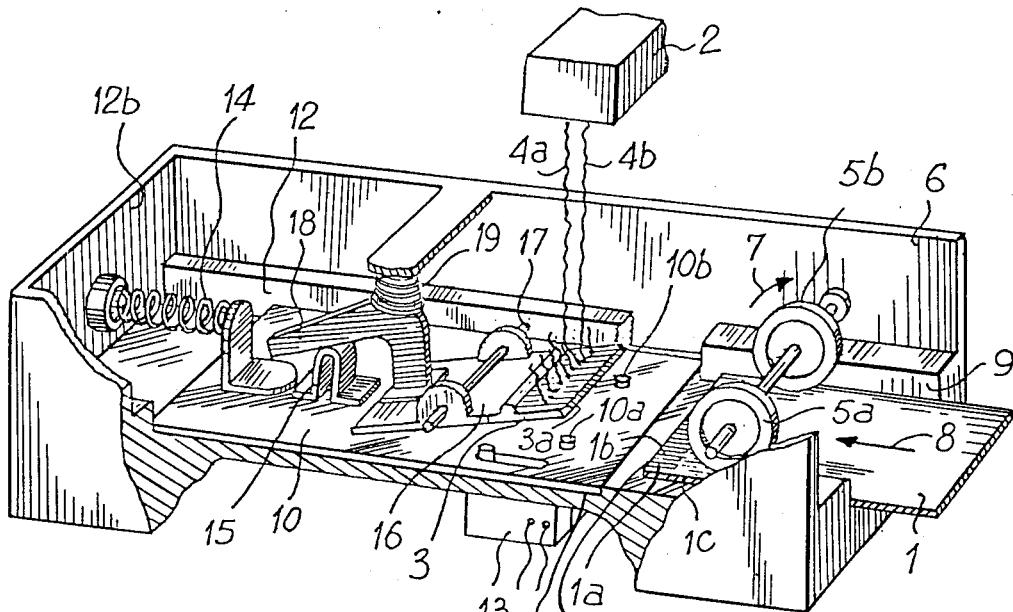
FIG. 1 illustrates a perspective broken away view of the connector showing the contacting mechanism, in its initial position (contact not as yet established)
Figure 1A:
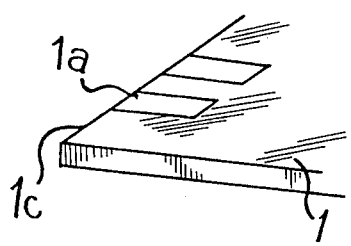
FIG. 1A illustrates a partial perspective view of the portable electronic card.
Figure 2:
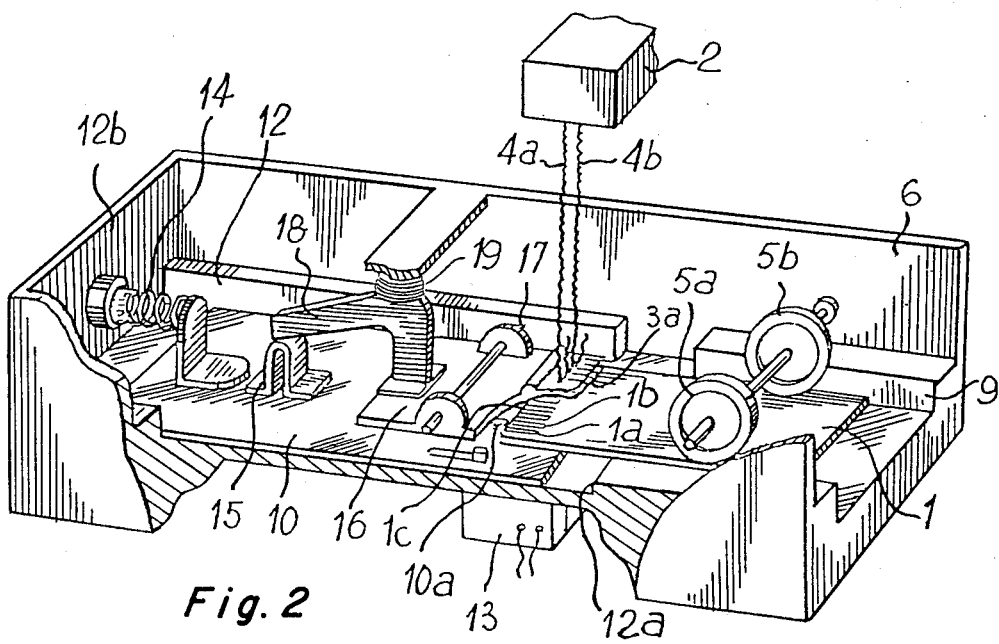
FIG. 2 illustrates a broken away perspective view of the connector showing the mechanism for contacting the connector in its final position (contact having been established)

FIGS. 1 and 2 illustrate a portable electronic credit card 1 comprising an electronic circuit in the form of an integrated circuit.

Figure 3:
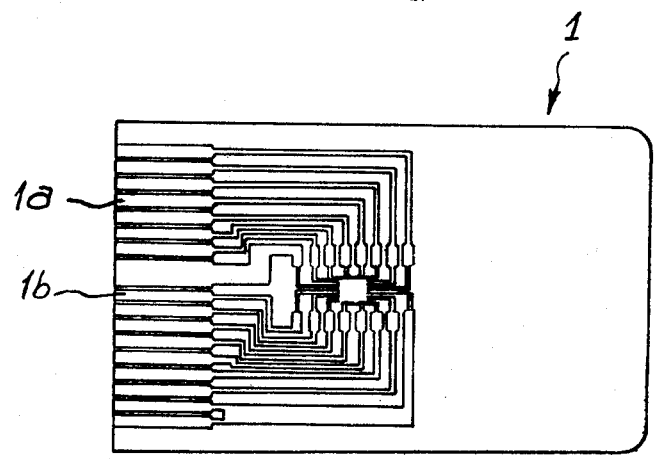
FIG. 3 illustrates a portable electronic card.
Figure 4:
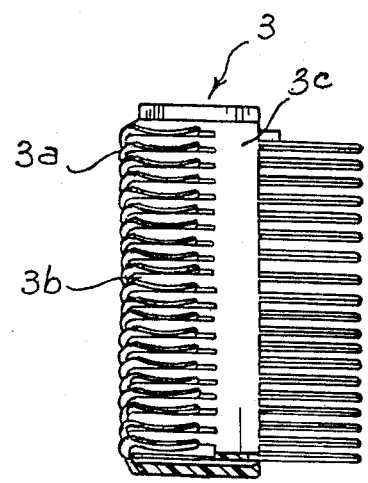
FIG. 4 illustrates a cross-bar of the connection element.

This credit card (see also FIG. 3) comprises output terminals such as 1a, 1b, etc. in the form of fine metallic lamella conductors arranged in parallel. These output terminals are adapted to electrically connect the electronic circuit of the credit card with an electric circuit of a transfer device such as 2 with which it will temporarily exchange information. To this end (see also FIG. 4), a cross-bar 3 comprising elongated conductor elements such as 3a, 3b, etc. elastically and resiliently mounted on a support 3c and electrically connected by cables such as 4a, 4b, etc. to the transfer device 2 come temporarily against the output terminals 1a, 1b, etc. as will be described below.

Two wheels 5a and 5b rotatably mounted on a frame 6, activated by an electric motor 52 whose direction of rotation is reversible (not shown), translationally drives by friction the card 1 on which they rest; the card being itself supported and guided by a guide path 9 integral with the frame 6. The periphery of the wheels 5a and 5b is covered with an anti-skid material having an elasticity which is sufficient to create the driving pressure by virture of friction.

When the wheels 5a and 5b turn in the direction of the arrow 7, the card is displaced in the direction of the arrow 8 until it abuts against the two projections 10a and 10b integral with a drawer 10 (a sliding plate) translationally movable in a guide path 12 equally provided in the frame 6. The guide path 12 is arranged along the extention of the guide path 9 of the card such that the translational displacement of the card in the direction of the arrow 8 moves the drawer 10 in the same direction (as shown in the comparison in FIGS. 1 and 2). The abutments 12a and 12b situated in the front and rear of the frame 6 limit the longitudinal path of the drawer 10. Furthermore, an electric reverser 13 mounted on the frame 6 and cooperating with the drawer 10 detects its front and rear positions and reverses the direction of rotation in which the motor driving the wheels 5a and 5b is being driven as a result.

A spring 14 is mounted between the frame 6 and on the drawer 10 and biases the drawer 10 in the opposite direction of the arrow 8.

A cam 15 is mounted on the drawer 10 and the roll of this cam will be explained below.

The cross-bar of the conductors 3 is mounted on a support 16 jointed with respect to the frame 6 around a transverse shaft 17; a slight desired play makes it possible for the cross-bar to be moved laterally (along the direction of the transverse shaft 17); the play is determined such that the amplitude of the lateral displacement of the associated connection elements 3a is less than the width of the terminal 1a.

The cross-bar 3 is arranged with respect to the frame 6 and with respect to the drawer 10 such that when the drawer is in the front position the connection elements 3a can be supported, by rocking of the support 16, on the terminals 1a. For the foremost position of the drawer 10, the contact zones between the connection elements 3a and the terminals 1a are the furthest spaced from the edge 1c of the card 1. For the most rearward position of the drawer 10 the terminals 1a, etc. and the elements 3a, etc. are no longer facing one another.

On the jointed support 16 is fastened a ramp 18 adapted to cooperate with the cam 15 of the drawer 10. The shapes of the cam 15 and of the ramp 18 are adapted such that:

When the drawer is in the rear position (as shown in FIG. 1), the support 16 is in the raised position (the terminals 1a and the connection elements 3a being neither in contact nor facing one another);

When the drawer advances (in the direction of the arrow 8), the support 16 remains in the raised position while the terminals 1a and the connections 3a are not facing one another one beneath the other;

As the drawer continues to advance, the support 16 rocks so as to bring the connection elements 3 to bear against the terminals 1a. In the course of this movement, the elements of the connection 3a move towards the terminals 1a in a direction having at least one component normal to the surface of the latter;

As the drawer continues to advance up to its foremost front position, the support 16 remains lowered in a fashion so as to maintain the connection elements 3a against the terminals 1a, the surfaces in contact displacing themselves tangentially one with respect to the other. As such, the tangential movement of drawer 10 is coordinated with clamping movement of conductor elements 3 against terminals 1a.

A spring 19 interposed between the frame 6 and the support 16 tends to maintain the support in the raised position against the action of the ramp 18 and of the cam 15.

Figure 5:
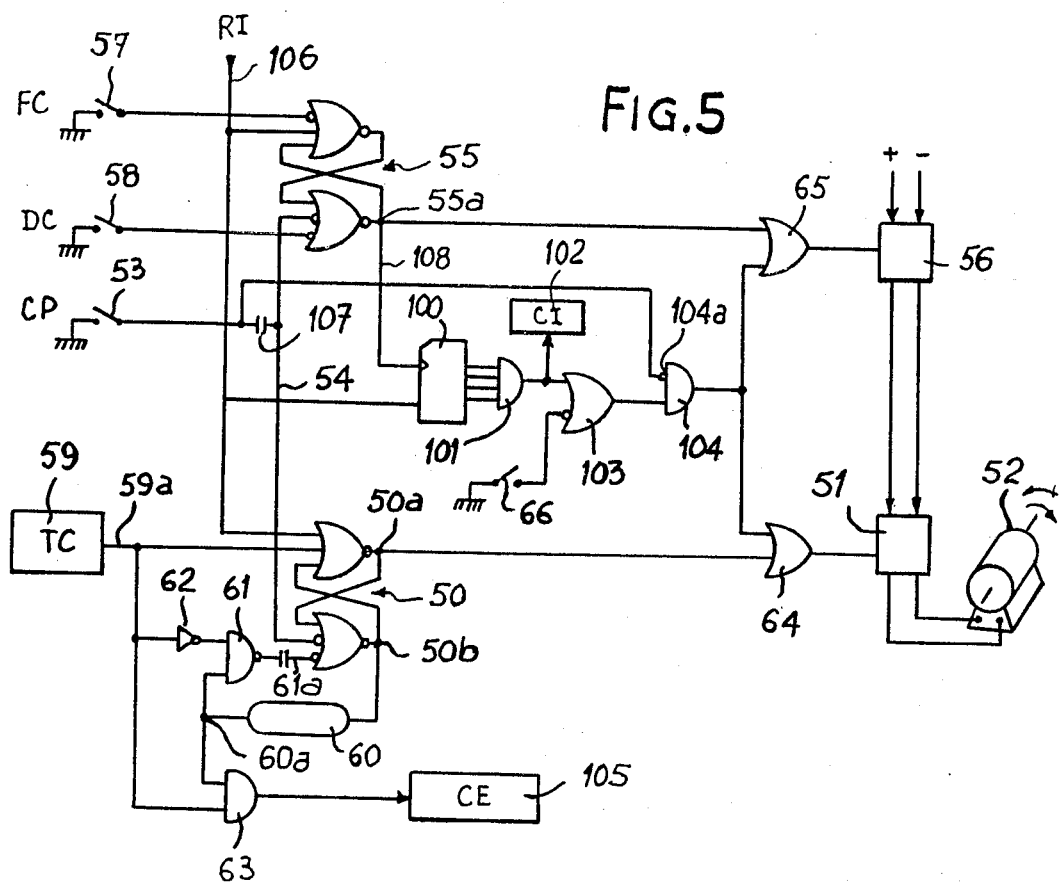
FIG. 5 illustrates the electronic circuit of the connector.

FIG. 5 which represents the electric circuit of the connector will now be described.

A bistable toggle switch 50 initially in the ZERO state (by virtue of the initial zero reset circuit 106) on the output 50a positions the interrupter 51 of the control of the electric motor 52 in the stop position.

A bistable toggle switch 55 initially in the ONE state (by virtue of the initial reset to zero circuit 106) at its output 55a positions the reverser 56 on the feed circuit of the motor 52 in its REAR movement (i.e., in a position such that the wheels 5a and 5b turn in a direction inverse to the arrow 7).

The introduction of the card is sensed by a photoelectric cell 53 (or a microcontact or a reed or HALL magnetic-type interrupter). This detector of the presence of the card is arranged in a fashion so as to be permanently activated and to emit a signal at the logic level ZERO when the card is in the connector. It sends by virtue of the capacitor 107 a signal via the conductor 54 on the one hand towards the toggle switch 50 to place it in the ONE state, and on the other hand towards the other toggle switch 55 to place it in the ZERO state.

It results respectively that the interrupter 51 switches to the START position thus starting the motor 52, and the direction controller 56 switches to the FORWARD movement position, which causes card 1 and the drawer 10 to advance as described above.

A contact 57 at the end of the passage (which forms a part of the reverser 13) detects the foremost portion of the drawer and switches toggle 55, to which it is connected, to the ONE state on the output 55a. As a result, a reversal of the movement of the motor 52 occurs while the controller 56 moves to the position of rearward motion.

Likewise, a contact 58 at the beginning of the passage (forming a part of the reverser 13) detects the rear maximum position of the drawer and switches the toggle 55 to which it is connected to its ZERO state on the output 55a. As a result, a new reversal of the direction of the motor 52 occurs, the controller 56 changing into the FORWARD movement position.

In other words, by virtue of these contacts 56 and 57 at the end of the passage, the card 1 alternatively travels from front to rear and the support drawer 16 lowers and raises itself completely during each cycle; the process of placing the card repeating itself completely.

When the test for the existence of correct alignment and electrical contact carried out by the test element 59 is positive, a signal is emitted in the direction of the toggle 50 to which this element is connected via its output 59a. This signal switches the toggle 50 to the ZERO state on the output 50a which causes the opening of the interrupter 51 in the stop position and the stopping of the motor 52.

To take into account the mechanical inertia of the motor and of its mechanisms, a delay line 60 of 0.06 seconds is connected to the output 50b of the toggle 50. This delay line is connected to one of the inputs of an AND gate 61 whose other input is connected via an inverter 62 to the output 59a of the good contact testing element. As a result, if at the end of the 0.05 seconds, which is necessary to permit the complete stopping of the card, the contact is not established, the gate 61 goes to the ZERO state at its output 61a and switches the toggle 50 with which it is connected to the ONE state on output 50a and the motor 52 is correspondingly placed in motion. On the contrary, if at the end of the 0.05 second delay necessary to permit the complete stoppage of the card, contact is properly established, the output 61a of the gate 61 remains in the ZERO state insuring the stoppage of the motor 52.

The outputs 59a and 60a of the test element 59 and of the delay line 60 are connected to an AND gate 63 delivering a control signal indicating on a display element 105 "contact established" i.e., that the contact is correctly established and enabling the exchange of data between the electronic circuit of the card 1 and the electric apparatus 2.

The outputs 50a and 55a of the toggles 50 and 55 are respectively connected to the stop-start interrupter 51 and to the forward-reverse controller 56 via two OR gates 64 and 65. The two OR gates are respectively connected by their other input via one AND-GATE 104 and one OR-GATE 103 to an element 66 delivering an ejection signal when the exchanges of information have been completed. This results in causing the motor 52 to move in a rearward fashion assuring the ejection of the card.

Between the element 66 delivering the ejection signal and the OR gates 64 and 65 is interposed an AND gate 104 whose other input 104a is connected to the contact 53 that detects the presence of the card. As a result, when the card is retracted from the connector, the AND gate 104 closes which results in the stoppage of the motor 52.

A counter 100, reset by the initial ZERO reset, is incremented by each passage of a card via the conductor 108 connected to the output 55a of the toggle 55. This counter (having 15 calls in the embodiment shown in FIG. 5) controls the opening of an AND gate 101 when the contents of its cells are full. This AND gate 101 emits a signal which indicates on the one hand on the display element 102, "contact impossible", i.e., that it has not been possible to obtain a correct electrical contact and, on the other hand, activates in turn the opening of an OR gate 103 mounted in series (via the AND gate 104) between the emitter element of the ejection control switch 66 and the OR gates 64 and 65. As a result, as was the case during the ejection phase previously described, the initiation of operation in the rearward direction of the motor 52 assures the ejection of the card.

Figure 6:
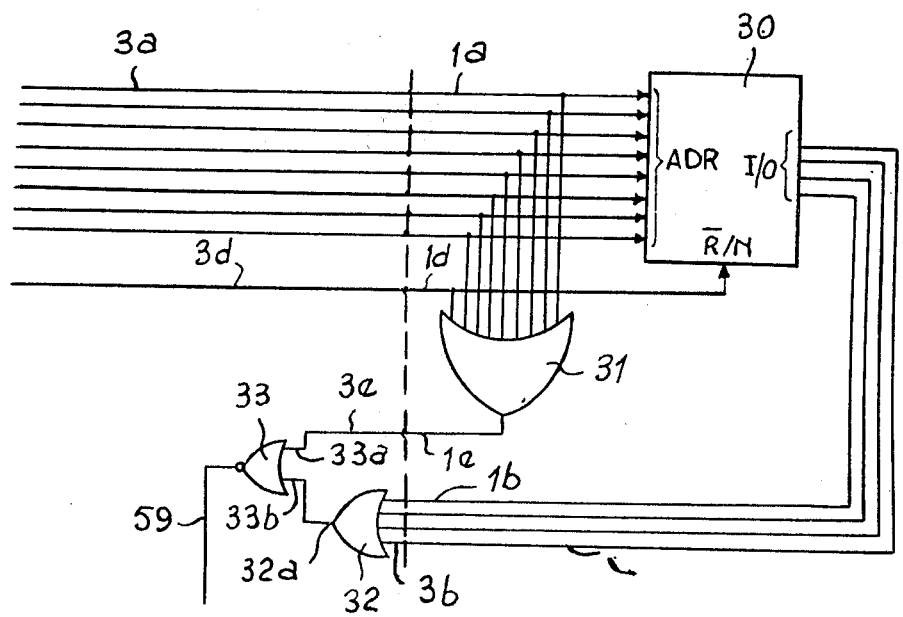
FIG. 6 illustrates the electronic circuit of the device for testing the electric contact.

The fashion in which it is possible to test whether or not the electric contacts have been correctly established between the terminals 1a and 1b and the connection elements 3a and 3b will now be described with reference to FIG. 6.

The electronic card (situated to the right of the dashed line) contains a memory 30 comprising here 256 words of 4 bits.

This memory, besides the feed lines (not shown), is connected to the exterior by means on the one hand of eight input addressing terminals such as 1a, and on the other hand with four output reading terminals such as 1b and equally by a writing or reading input terminal 1d (the reading of the contents of the memory being strobed by a ZERO level at the input 1d).

In the card is arranged an OR gate 31 whose nine various noted inputs (FIG. 6) are connected in parallel across the inputs 1a and 1d. The output of the OR gate 31 is connected to the terminal 1e respectively in contact with the connection element 3e. The outputs of connection elements 3b are connected in parallel with the inputs of an OR gate 32. The output 32a of the OR gate 32, as well as the output of the connection element 3e, are connected to the two inputs 33a and 33b from a NOR gate 33.

By convention, the first address 00000000 (eight zeros) of the memory contains the information 0000 (four zeros). Furthermore, by construction, a logic input that is not connected ("in the air") stays at the level of logic ONE.

To test whether or not the electric contact has been well established, it suffices to read the content of the first address. If a logic level ONE appears on the output 59 of the NOR gate 33 all of the electric contacts are correct; if not, one of the electric contacts (1a, 1d, 1e, or 1b) is incorrect.

In effect, it should first be noted that for the card to be able to operate, it is necessary that the electricl feed contacts be correct in the first place. Improper functioning of the feed contacts will result in a level ONE across the input 33b. Furthermore, a defect in the contacts 1a . . . and 1d results in a wire-in-the-air condition on one of the parallel inputs of the OR gate 31, i.e., by a level ONE across the input 33a. In a like fashion, a defect on the contact 1e results in a level ONE across the input 33a. On the contrary, a good contact on the contacts 1a, 1d, 1e results in a ZERO level on the input 33a.

Finally, a bad contact on the terminals 1b results in a ONE level (wire-in-the-air) on the input 33b. On the other hand a good contact indicating the existence of correct alignment and electrical contact results in a ZERO level at 33b (the content of the first address being 0000 (four zeros).

In a general fashion, whatever the nature of the electric or the electronic circuits which are used in the card, it is possible to test for the proper electrical contact indicating the existence of correct alignment and electrical contact by making the card carry out predetermined operations for which it is known which response predetermined it must furnish (the test must be chosen in a fashion so as to operate all of the electrical contacts). The comparison of the result achieved and of the result expected informs as to the state of the contact.

Figure 7:
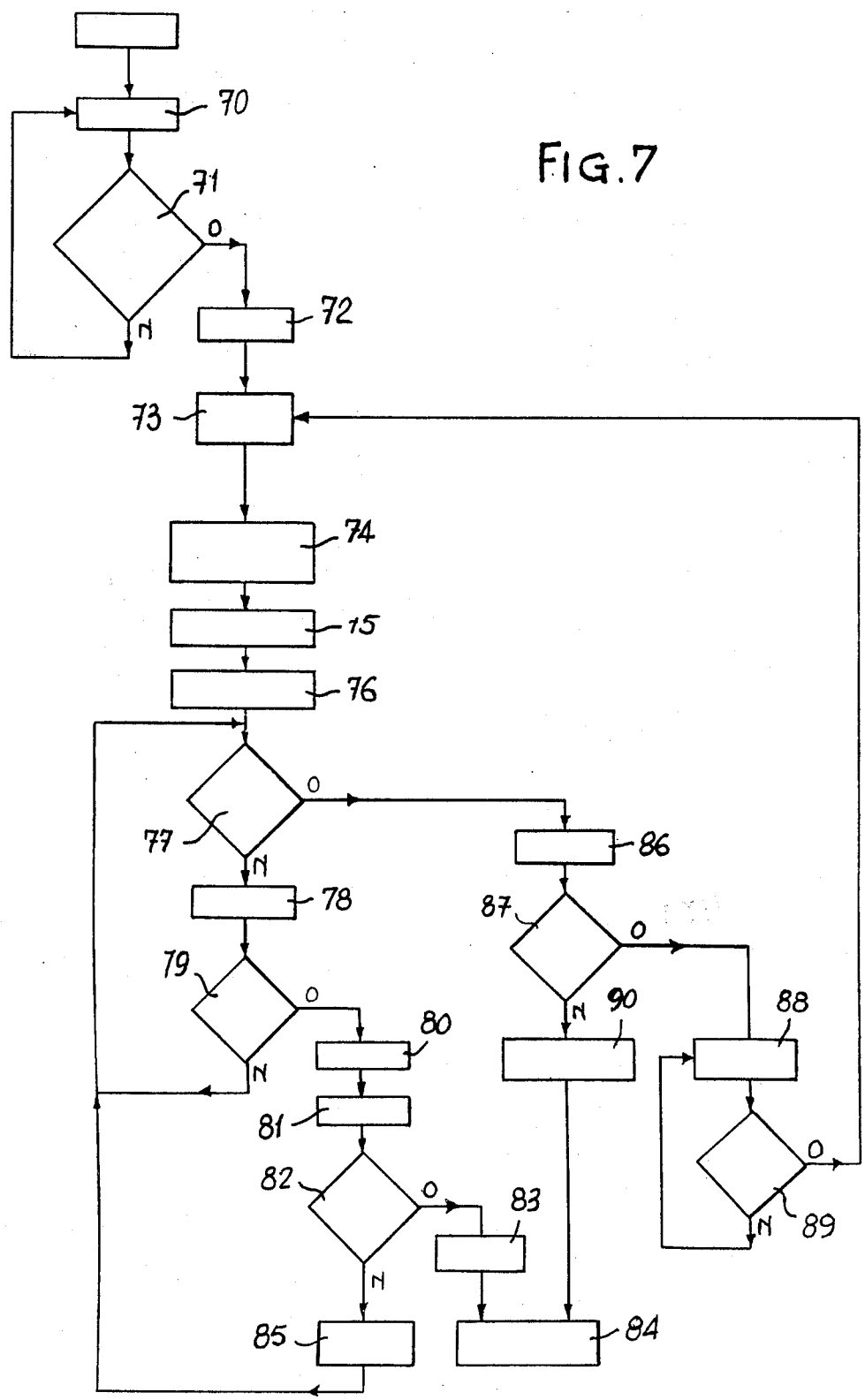
FIG. 7 illustrates the functioning algorithm of the connector.

The functioning of a connector according to the invention will now be described with respect to FIG. 7 which is a flow chart that illustrates the functioning algorithm.

The connector is initially in the hold position (hold 70) ready to receive a card 1.

As soon as the card has been introduced, (introduction-of-card? 71) a counter is set to ZERO (72).

The drive system of the card is then started (73). The card advances and the contact surfaces face one another (contacts facing one another 74) and then approach (approach of surfaces 75) until they touch (mechanical contact of the surfaces 76).

If the card has not attained its maximal front position (end of passage? 77) it continues to advance (advance 78).

If the electrical contact is correct (good electrical contact? 79) the motor stops (motor stop 80) and a wait of 0.05 seconds is counted (wait 0.05 seconds 81).

If, at the end of this wait of 0.05 seconds, the electrical contact is still correct (electrical contact correct? 82) a "good contact" signal is emitted indicating the existence of correct electrical cooperation (signalling "good contact" 83) and ends (end 84) the operating cycle of the connector.

If, at the end of the 0.05 second wait, the electric contact is incorrect, the motor starts up again (motor startup 85) the card continues to advance and the operating cycle begins according to the cycle of processes defined from the branch 77. If at 77 (end-of-passage?) the response is positive, in other words, if the drawer 10 has attained its maximal rearward position, the counter is incremented by a unit (counter incrementation 86).

If subsequent to this incrementation, the counter does not attain the maximum predetermined value, the direction of rotation of the motor is reversed (retraction 88). The card begins to retract. If the card has retracted sufficiently it attains its maximum frontal position (begining-of-the-passage? 89), the cycle starts up again at 73; the card advances again. If it has not retracted sufficiently, the card continues to retract (during this phase of the retraction, one may equally proceed to the determination of proper electrical contact which has not been described on the algorithm but which has been provided for in the electric schematic diagram of FIG. 5).

If the counter, at the end of successive cycles, attains its maximum predetermined value, the cycle continues at 87 with an indication of the impossibility of obtaining a good contact (signal-"contact impossible" 90). The cycle is thus completed (end 84) and the card can be ejected for example, or captured by the apparatus.

The counter avoids the useless multiplication of cycles particularly in the case of definite deterioration of the contact. One can think in effect that beyond a certain number of attempts to obtain a good contact it is worth stopping.

In the embodiment of the invention described with reference to the figures, the card and the connection mechanism are activated by an electric motor. In other embodiments, it may be activated differently, in particular the displacement of the card and of the drawer can be due to the carrier of the card who introduces it. In this latter case, the relative movements of the contact surfaces will be essentially guided by guiding means, particularly ramps.

In a like fashion, the translationally movable drawer may be replaced by a jointed shutter which is rotationally and translationally movable (in the same fashion as introduction mechanisms for magnetic cassettes in tape readers).

Furthermore, the card, the drawer and the support of the connection cross-bar can be arranged on the frame such that the whole cross-bar and the card is instantaneously immobilized with respect to one another as soon as the contact is correct. The inertia of the manual or mechanic driving mechanisms will thus result in the displacement of both the cross-bar and the card without modifying the position of the zones in contact with one another. Such a solution makes possible, notably in the absence of a motor, to manually introduce the card without having to be concerned with the instant when the contact is correctly established.

In the situation where the removable electrical article is an electronic device of the type described in particular in French Pat. No. 2,311,360 and assumes the form of a "credit card" made out of thin plastic material including a special integrated circuit (grouping around the PROM memory diverse treatment input/output control circuits), a very high level of security may be required in certain applications such as:

a payment card;

an identification card for verifying the right to access, etc.;

It is thus necessary to protect against certain forms of trickery and fraud particularly, such as:

counterfeiting of the card;

simulation of its operation.

Such a card may, in effect, be counterfeited by replacing the special integrated circuit which it contains by the ensemble of electronic components (standard PROM memory, microprocessor, power interfaces, etc.), thereby acting electrically in the same fashion as the reference circuit.

This counterfeiting of the card may be achieved in two fashions:

1. In assembling the components (mechanically and electrically) on a substrate in a form such that the entire device is adapted to itself be included in the thickness of the card (equal to approximately 0.76 mm). To minimize the possibility of counterfeiting, it suffices to provide on the devices adapted to cooperate with the cards (access verification gates, banknote distributors, point of sale terminals, etc.), an entrance slot whose dimensions are calibrated to the exact shape of a reference card of about 0.1 mm for example. This simple arrangement makes it possible to, in effect, totally discourage the major portion of potential counterfeiters (radio amateurs, electronic or microcomputer tinkerers, scientific criminals, etc.), which constitute the most dangerous fraction (because it is the most numerous). The danger is thus limited to the population of specialized technicians in the processes of microsoldering, these people being able, furthermore, to have at their disposition highly specialized tools used in the hybrid circuit industry.

2. By fashioning by means of these components an electronic assembly entirely distinct from the card and as a result exterior thereto. In this fashion it would be possible to uilize a specific apparatus as voluminous as is necessary to most perfectly imitate the functioning of the card. This simulation device would be connected to the contacts (to the coupling elements of the card) by a flexible cable having several conductors. To discourage this other form of counterfeiting, it suffices to provide on the devices adapted to cooperate with the cards an entrance slit which is protected by a guillotine closure system whose movable portion in the form of a sharp blade being capable of opening during the introduction of the card and closing once the card has been introduced. A simple microcontact will signal the complete closure of the guillotine door and of the absence of foreign bodies (wires), at the level of the threshold. When very fine wires are used, these will be either cut or short-circuited by the blade cutter.

Finally, it should be noted that in the two types of counterfeiting, the cooperating devices will have no difficulty in detecting the abnormal character of operation of these cards:

by testing the amount of electric power consumed by the card (this being higher most of the time in the case of a microprocessor assembly);

by testing the response time of the card (principally the writing time) this being necessarily greater in the case of a microprocessor assembly by virtue of the vast number of elementary tasks (microinstructions) necessary to accomplish a complete function.

It is clear that the means which have just been described to avoid a defrauding of a credit card can be adapted without difficulty onto a connector according to the present invention, specifically at the input of the connector upstream of the driving wheels 5a and 5b.

The invention having now been described and its value illustrated by various detailed examples, the Applicant reserving the exclusivity, during the entire duration of the patent without limitation besides the terms of the claims hereafter.

I claim:

1. Method for electrically connecting a removable article having at least one electric circuit thereon, with an electric device, which cooperates with said removable article, said removable article having electrically conductive terminals and said electric device having conductor elements, both said electrically conductive terminals and said conductor elements having corresponding contact surfaces, the method comprising the steps of:
  (a) bringing, respectively, said corresponding contact surfaces of said electrically conductive terminals into contacting relationship with said corresponding contact surfaces of said conductor elements;
  (b) testing said corresponding contact surfaces for the existence of correct alignment and electrical contact between said corresponding contact surfaces; and
  (c) displacing said corresponding contact surfaces relatively, in a direction tangential to said corresponding contact surfaces if said testing determines non-alignment and non-existence of correct electrical contact, and stopping the relative displacement of corresponding contact surfaces when said testing determines said alignment and existence of correct electrical contact.

2. Method as defined by claim 1 wherein said terminals are elongated and parallel with respect to one another; and wherein said conductor elements are elongated and parallel with respect to one another.

3. Method as defined by claim 2 comprising displacing said corresponding contact surfaces in the direction of elongation of said terminals and said conductor elements.

4. Method as defined by claim 1 wherein said step of bringing said corresponding contact surfaces into said contacting relationship comprises bringing said corresponding contact surfaces face-to-face with one another; and alternating said coresponding contact surfaces relatively toward and away from one another.

5. Method as defined by claim 4 comprising coordinating said bringing of said corresponding contact surfaces of step (a) with said step of displacing said corresponding contact surfaces relatively of step (c), the sequence of steps (a)-(c) being repeated if said testing determines non-alignment and non-existence of correct electrical contact and being stopped when said testing determines said alignment and existence of correct electrical contact.

6. Method as defined by claim 1 comprising repeating said step of bringing said corresponding contact surfaces into contacting relationship of step (a) and said step of displacing said corresponding contact surfaces relatively of step (c) for a predetermined number of times if said testing determines non-alignment and non-existence of correct electrical contact, and stopping said steps as soon as said testing determines said alignment and existence of correct electrical contact.

7. Method as defined by any one of claims 1, 2, 3, 4, 5, or 6 wherein said step (c) of displacing said corresponding contact surfaces relatively comprises a random displacement of said corresponding contact surfaces with respect to one another in a transverse direction with respect to the direction of elongation of said corresponding contact surfaces between two successive alternating relative displacements.

8. Method as defined by claim 1 wherein said step of testing said corresponding contact surfaces for said existence of correct electrical contact comprises: performing predetermined operations which provide a predetermined expected response from the removable article upon the existence of correct alignment and electrical contact; and comparing the actual response of said removable article with the predetermined expected response.

9. Method as defined by claim 1 wherein said electrically conductive terminals of said removable article comprise substantially planar electrically conductive strips; and said conductor elements of said electrical device comprise resilient elongated conductor elements.

10. Apparatus for electrically interconnecting an electric device with a removable article having at least one electric circuit, said removable article having corresponding contact surfaces and said electric device having coresponding contact surfaces, contact between said corresponding contact surfaces serving to electrically connect said electric device with said removable article, said apparatus comprising:
- (a) means for accepting said removable article in a predetermined position wherein said corresponding contact surfaces of said removable article generally correspond to said corresponding contact surfaces of said electric device;
- (b) means for bringing said corresponding contact surfaces of said electric device into contacting relationship with said corresponding contact surfaces of said removable article;
- (c) means for testing said corresponding contact surfaces for alignment and the existence of correct electrical contact between said corresponding contact surfaces; and
- (d) means for displacing said corresponding contact surfaces relatively.

11. Apparatus as defined by claim 10 wherein said means for displacing said corresponding contact surfaces comprises means for displacing said corresponding contact surfaces of said removable article and said electric device in an alternating fashion.

12. Apparatus as defined by claim 10 comprising a plurality of elongated corresponding contact surfaces on said removable article, said corresponding contact surfaces being parallel with respect to one another.

13. Apparatus as defined by claim 12 wherein said means for displacing said corresponding contact surfaces include guide means for guiding said removable article to permit forward and rearward motion in a direction generally parallel to the direction of elongation of said corresponding contact surfaces.

14. Apparatus as defined by claim 10 wherein said means for bringing said contact surfaces of said electric device into contacting relationship with said contact surfaces of said removable article is adapted to bring said contact surfaces of said electric device and removable article to face one another, and comprises means for relatively moving said corresponding contact surfaces towards and away from one another in an alternating manner.

15. Apparatus as defined by claim 10 comprising a movable support member carrying said corresponding contact surfaces of said device, a slide member adapted to move by abutment of said removable article against said slide member, said slide member being biased against said abutment by a resilient force, and cam means arranged between said slide member and said movable support member, whereby said movable support member causes an alternating relative displacement between said contact surfaces of said electric device and said contact surfaces of said removable article towards and away from each other.

16. Apparatus as defined by claim 15 comprising means responsive to the position of said slide member for controlling said alternating relative displacement between said corresponding contact surfaces.

17. Apparatus as defined in claim 15 wherein said movable support member is capable of free limited transverse motion with respect to the direction of elongation of said corresponding contact surfaces whereby a random displacement of the corresponding contact surfaces, one with respect to the other, between two of said successive alternating displacements is obtained.

18. Apparatus as defined by claim 10 comprising means for repeating the operation of means (a)-(d) a predetermined number of times if said means for testing indicates non-alignment and non-existence of said correct electrical contact between said corresponding contact surfaces and means for stopping the operation of means (b)-(d) when said means for testing indicates alignment and existence of said correct electrical contact.

19. Apparatus as defined by claim 18 wherein said electrically conductive terminals of said removable article comprise substantially planar electrically conductive strips and said conductor elements of said electric device comprise resilient elongated conductor elements.

20. Apparatus as defined by claim 10 wherein said means for testing said alignment and existence of correct electrical contact between said electric device and said removable article through said corresponding contact surfaces comprises:
- (a) means for applying a predetermined electric signal to at least one contact surface of said electric device whereby said removable article performs predetermined operations corresponding to a predetermined expected response from the removable article; and
- (b) means for comparing the actual response of said removable article to a predetermined expected response of said removable article in response to said electric signal.

21. Apparatus as defined by claim 20 wherein said removable article carries stored information which produces said predetermined expected response when said predetermined electric signal is applied to said removable article.

* * * * *

UNITED STATES PATENT AND TRADEMARK OFFICE
CERTIFICATE OF CORRECTION

PATENT NO. : 4,404,464

DATED : September 13, 1983

INVENTOR(S) : Roland MORENO

It is certified that error appears in the above-identified patent and that said Letters Patent is hereby corrected as shown below:

Column 5, line 38, "0.06" should read ---0.05---.

Column 6, lines 42-44, after "nine" insert ---various inputs are connected in parallel across the inputs noted 1a and input 1d (Fig. 6).---

Column 6, line 64, "electricl" should read --- electrical---.

Column 7, lines 17-18, "response predetermined" should read ---predetermined response---.

Column 11, line 2, "coresponding" should read ---corresponding---.

Column 11, line 32, delete "include" and substitute ---comprise--- therefor.

Signed and Sealed this

Third Day of April 1984

[SEAL]

*Attest:*

*Attesting Officer*

GERALD J. MOSSINGHOFF

*Commissioner of Patents and Trademarks*